United States Patent [19]

Shin et al.

[11] Patent Number: 5,019,881
[45] Date of Patent: May 28, 1991

[54] NONVOLATILE SEMICONDUCTOR MEMORY COMPONENT

[75] Inventors: Yun-Seung Shin; Sung-Oh Chun, both of Seoul, Rep. of Korea

[73] Assignee: Samsung Electronics Co., Ltd., Suwon, Rep. of Korea

[21] Appl. No.: 391,865

[22] Filed: Aug. 10, 1989

[30] Foreign Application Priority Data

Nov. 29, 1988 [KR] Rep. of Korea .................. 8815779

[51] Int. Cl.$^5$ ............................................. H01L 29/78
[52] U.S. Cl. .................................... 357/23.5; 357/12; 357/23.6
[58] Field of Search ..................... 357/23.5, 23.6, 12

[56] References Cited

U.S. PATENT DOCUMENTS 4,823,316  4/1989  Riva ................................... 357/23.5
4,845,538  7/1989  Hazani ............................... 357/23.5
4,894,802  1/1990  Hsia et al. ......................... 357/23.5

Primary Examiner—Edward J. Wojciechowicz
Attorney, Agent, or Firm—Ladas & Parry

[57] ABSTRACT

The invention provides a nonvolatile semiconductor memory component comprising: field region of thick oxide, the first and second active regions surrounded with the field region, the first and second gate insulating layers on the first and second active regions, the first gate of a low resistance formed on the first and second gate insulating layer, the third insulating layer on the first gate of a low resistance the second gate of a low resistance formed on the third insulating layer, the channel region below the first gate insulating layer formed by the first gate, and the highly doped drain and source separated by channel region opposite to the type of the substrate. In addition, the process for forming the transistor with one channel and the substrate diffusion can be achieved on the semiconductor substrate or opposite type well formed on the semiconductor substrate. Programming at a low voltage may be possible and the reliability characteristics of the cell may be improved according to present invention.

1 Claim, 1 Drawing Sheet

NONVOLATILE SEMICONDUCTOR MEMORY COMPONENT

BACKGROUND OF THE INVENTION

The present invention relates to a nonvolatile semiconductor memory component, particularly to its structure.

In the conventional nonvolatile memory cell, a dc voltage 12–15 V is applied to a control gate 6 and 6–8 V, enough to generate hot electrons in drain region, is applied to a drain 7 to inject electrons into a floating gate 5 during a program. So, cell becomes enhancement type as more hot electrons, having enough energy to surmount gate oxide barrier, store at the floating gate. Thus, a large dc current flows in cell array because a high voltage is applied to the control gate 6 and drain 7 during the program.

In addition, OV is applied to the control gate 6 and dc 12–18 V is also applied to the drain 7 to erase the cell array, thereby causing the injected electrons to tunnel through gate oxide toward the drain 7. Thus, floating gate oxide 2 degradation problem will be occurred as the number of program/erase cycles increase.

SUMMARY OF THE INVENTION

The present invention has been made to improve floating gate oxide reliability problem and to achieve low power dissipation because it can be programmed by relatively low voltage.

According to the present invention, there is a nonvolatile semiconductor memory component comprising: a field region of thick oxide, the first and second active regions surrounded with the field region, the first and second gate insulating layers on the first and second active regions, the first gate of a low resistance formed on the first and second gate insulating layer, the third insulating layer on the first gate, the second gate of a low resistance formed on the third insulating layer, the channel region below the first gate insulating layer formed by the first gate, and the highly doped drain and source of opposite type with the substrate. In addition, the processes for forming the transistor with one channel and n+ substrate diffusion can be achieved on the opposite-type well instead of the semiconductor substrate.

DETAILED DESCRIPTION OF THE INVENTION

The present invention will be now described in more detail with reference to accompanying drawings.

Figure 1:
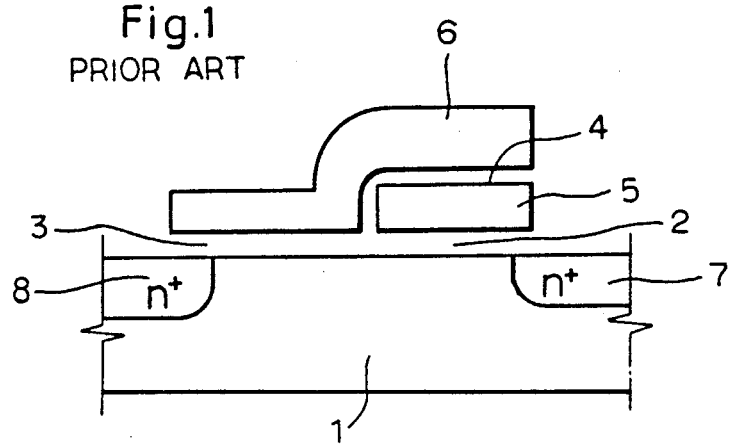
FIG. 1 is a vertical structure of the conventional cell.
Figure 2A:
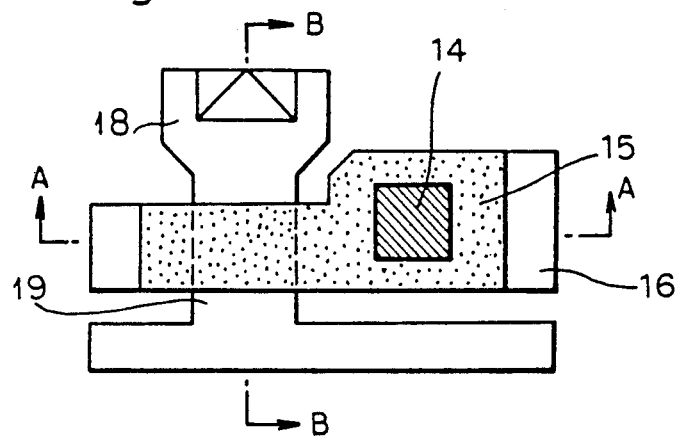
FIG. 2(a) is a plan view of a memory cell according to this invention.
Figures 2B, 2C:
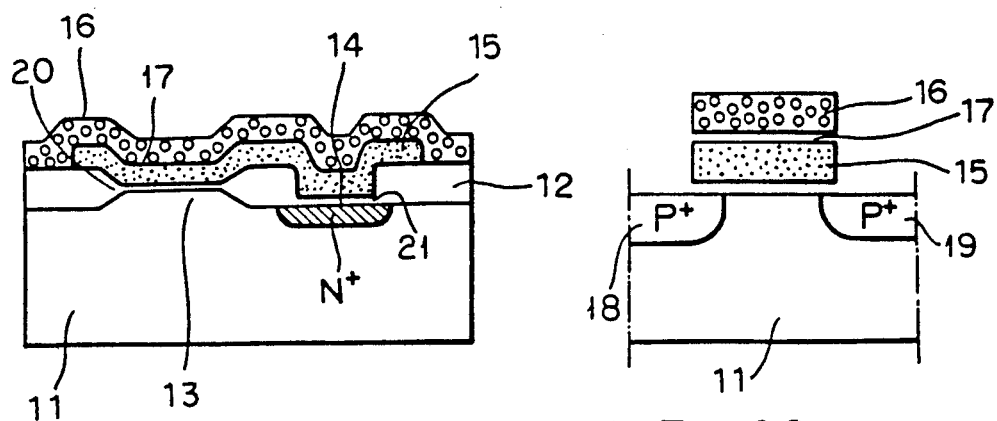
FIG. 2(b) is a vertical section taken along line A—A of FIG. 2(a).
FIG. 2(c) is a vertical section taken along line B—B of FIG. 2(a).

FIGS. 2(a)–(c) show the cell layout and vertical structures of the present invention.

In FIG. 2, 11 and 12 represent the n-substrate and field oxide respectively, and 13 and 21 represent the channel of the transistor and the tunnel oxide, while 15, 16, and 17 represent the floating gate, the control gate, and the interpoly oxide respectively.

To describe the structure of the present invention, first, the MOS transistor with one channel and the n+ substrate diffusion are formed on semiconductor substrate 11, and the tunnel oxides 20 and 21 are formed on the said n+ substrate diffusion and the floating gate 15 is formed on the tunnel oxides 20 and 21 and the transistor with one channel. Next, the control gate 16 is formed after the formation of the interpoly oxide 17.

The operating condition is as follows. As shown in FIG. 2(b), if the negatively high voltage is applied to the control gate and 5 V is applied to the semiconductor substrate 11 to erase the cell array, the electric field proportional to the voltage difference between semiconductor substrate 11 and floating gate is induced by capacitive coupling across the tunnel oxide 21.

If the magnitude of the electric field is sufficiently high to tunnel electron, electrons at the floating gate leave the floating gate for the substrate. The threshold voltage VTE of the erased cell becomes sufficiently negative (VTE<<0).

If the gate-to-source voltage is applied larger than the thresholdvoltage after erase state, the transistor is turned on and current flows. If the drain-to-source voltage VDS is sufficiently small (VDS 0), hot electrons are generated at the channel depletion region near the drain. Some of these hot electrons are injected into floating gate because of having enough energy to surmount gate oxide barrier. Thus, the programmed cell becomes the transistor of depletion type or low threshold voltage Vtp after a program, so that the threshold voltage of the programmed cell shifts positively.

To determine the data after program/erase (1 or 0), dc 3 V and 5 V are applied to the drain and source respectively. Also, 3 V is applied to the gate, thereby determining the date (1 or 0) according to the on/off of the cell.

As mentioned above, the program can be achieved at a low voltage and the reliability characteristics of the cell can be improved by forming the substrate diffusion and the tunnel oxide on the substrate.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the ture scope of the invention.

What is claimed is:

1. A memory cell comprising a semiconductor substrate (11) of a first conductivity type having a major surface, a field isolation region (12) comprising a thick oxide on portions of said major surface;

source (18) and drain (19) regions of a second conductivity type in said substrate at said major surface;

a channel region (13) in said substrate at said major surface and disposed between said source (18) and drain (19) regions;

a tunnel region (14) of said first conductivity type spaced apart from said source (18), drain (19) and channel (13) regions, and of a higher doping concentration than said substrate (11);

a first dielectric layer (20) on said major surface overlying said channel region (13);

a second dielectric layer (21) on said major surface overlying said tunnel region (14);

a low resistance and continuous floating gate (15) extending over said first (20) and second (21) dielectric layers and over said channel and tunnel regions and partially over said field isolation region (12);

a third dielectric layer (17) extending over said floating gate (15); and a low resistance and continuous control gate (16) extending over said third dielectric layer (17) and over said channel and tunnel regions and capacitively coupled to said floating gate.

* * * * *